US009465538B2

(12) United States Patent
Lai

(10) Patent No.: US 9,465,538 B2
(45) Date of Patent: Oct. 11, 2016

(54) FLASH MEMORY CONTROL CHIP AND DATA STORAGE DEVICE AND FLASH MEMORY CONTROL METHOD

(71) Applicant: VIA TECHNOLOGIES, INC., New Taipei (TW)

(72) Inventor: Yi-Lin Lai, New Taipei (TW)

(73) Assignee: VIA TECHNOLOGIES, INC., New Taipei (TW)

(*) Notice: Subject to any disclaimer, the term of this patent is extended or adjusted under 35 U.S.C. 154(b) by 97 days.

(21) Appl. No.: 14/469,703

(22) Filed: Aug. 27, 2014

(65) Prior Publication Data
US 2015/0324283 A1   Nov. 12, 2015

(30) Foreign Application Priority Data

May 12, 2014  (TW) .............. 103116671 A

(51) Int. Cl.
*G06F 12/02* (2006.01)
*G11C 29/42* (2006.01)
*G06F 3/06* (2006.01)
*G06F 11/10* (2006.01)
*G11C 29/52* (2006.01)
*G06F 12/06* (2006.01)

(52) U.S. Cl.
CPC ............ *G06F 3/06* (2013.01); *G06F 11/1072* (2013.01); *G06F 12/0246* (2013.01); *G06F 12/06* (2013.01); *G11C 29/42* (2013.01); *G11C 29/52* (2013.01); *G06F 2212/7201* (2013.01)

(58) Field of Classification Search
CPC .......... G06F 12/0246; G06F 11/1072; G06F 2212/7201; G11C 29/52; G11C 29/42
See application file for complete search history.

(56) References Cited

U.S. PATENT DOCUMENTS

| | | | |
|---|---|---|---|
| 7,191,306 B2 | 3/2007 | Myoung et al. | |
| 7,434,122 B2 | 10/2008 | Jo | |
| 8,966,205 B1* | 2/2015 | Lo ................ | G06F 12/0246 711/165 |
| 2003/0165076 A1* | 9/2003 | Gorobets ......... | G06F 3/0613 365/200 |
| 2006/0282644 A1* | 12/2006 | Wong ............. | G06F 12/0246 711/206 |
| 2011/0161613 A1* | 6/2011 | Sepulveda ....... | G06F 11/1441 711/165 |

* cited by examiner

*Primary Examiner* — Esaw Abraham
*Assistant Examiner* — Kyle Vallecillo
(74) *Attorney, Agent, or Firm* — McClure, Qualey & Rodack, LLP

(57) ABSTRACT

A flash memory control method, storing a logical-to-physical address mapping relationship between a host and a flash memory and a root table in the flash memory and providing a non-volatile storage area storing a root table pointer. A mapping relationship pointer is set forth in the root table to show where the logical-to-physical address mapping relationship is stored in the flash memory. The root table pointer points to the root table stored in the flash memory. In response to a power restoration request issued from the host, the flash memory is accessed based on the root table pointer and thereby the root table is read and the logical-to-physical address mapping relationship is retrieved from the flash memory based on the mapping relationship pointer set forth in the root table.

15 Claims, 6 Drawing Sheets

FLASH MEMORY CONTROL CHIP AND DATA STORAGE DEVICE AND FLASH MEMORY CONTROL METHOD

CROSS REFERENCE TO RELATED APPLICATIONS

This application claims priority of Taiwan Patent Application No. 103116671, filed on May 12, 2014, the entirety of which is incorporated by reference herein.

BACKGROUND OF THE INVENTION

1. Field of the Invention

The present invention relates to data storage devices with flash memory and flash memory control methods.

2. Description of the Related Art

Flash memory is commonly used in data storage devices as a storage medium. NAND flash is a common flash memory.

Flash memory is typically used in memory cards, USB flash devices, solid-state drives (SSDs), and so on. In another application with multi-chip package technology, a NAND flash chip and a controller chip are combined in one package as an embedded multi-media card (eMMC).

A flash memory provides a storage area which is divided into blocks, and each block includes a plurality of pages. The space of one block is reused after the entire block is erased. When updating data stored in the flash memory, the new data is written into a spare area rather than being overwritten onto the old data and the old data is regarded invalid. Thus, the storage area management of the flash memory is different and more complex than the other types of storage mediums. Generally, a logical-to-physical address mapping relationship between the host and the flash memory is recorded in the flash memory for the storage space management. The logical-to-physical address mapping relationship has to be updated when the host writes data into the flash memory. If a power failure event occurs during the update of the logical-to-physical address mapping relationship, the logical-to-physical address mapping relationship recorded in the flash memory may be unreliable (not updated in time). During the power recovery process, it may waste a lot of time to scan all blocks of the flash memory for restoring the correct logical-to-physical address mapping relationship in the flash memory.

BRIEF SUMMARY OF THE INVENTION

A flash memory control chip in accordance with an exemplary embodiment of the disclosure operates a flash memory in accordance with commands issued from a host. The flash memory control chip includes a first non-volatile storage area and a microcontroller. In addition to a logical-to-physical address mapping relationship between the host and the flash memory, the microcontroller further stores a root table in the flash memory. A mapping relationship pointer is set forth in the root table to indicate where the logical-to-physical address mapping relationship is stored in the flash memory. Furthermore, the microcontroller also stores a root table pointer in the first non-volatile storage area. The root table pointer is configured to indicate where to the root table is stored in the flash memory. When the host issues a power restoration request, the microcontroller retrieves the logical-to-physical address mapping relationship from the flash memory in accordance with the root table pointer. In comparison with conventional technologies, the logical-to-physical address mapping relationship between the host and the flash memory is quickly and correctly rebuilt in response to the power restoration request without wasting time in searching the entire flash memory.

In another exemplary embodiment, the flash memory control chip and the flash memory are combined together to form a data storage device.

In another exemplary embodiment, a flash memory control method is shown, comprising the following steps: providing a first non-volatile storage area; storing a logical-to-physical address mapping relationship between the host and the flash memory in the flash memory; storing a root table in the flash memory, wherein a mapping relationship pointer is set forth in the root table to indicate where the logical-to-physical address mapping relationship is stored in the flash memory; storing a root table pointer into the first non-volatile storage area, the root table pointer being configured to indicate where the root table is stored in the flash memory; and retrieving the logical-to-physical address mapping relationship from the flash memory in accordance with the root table pointer in response to a power restoration request issued from the host.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3B-1 and FIG. 3B-2 show a flowchart depicting step S206 of FIG. 2 in detail based on the architecture of FIG. 1.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
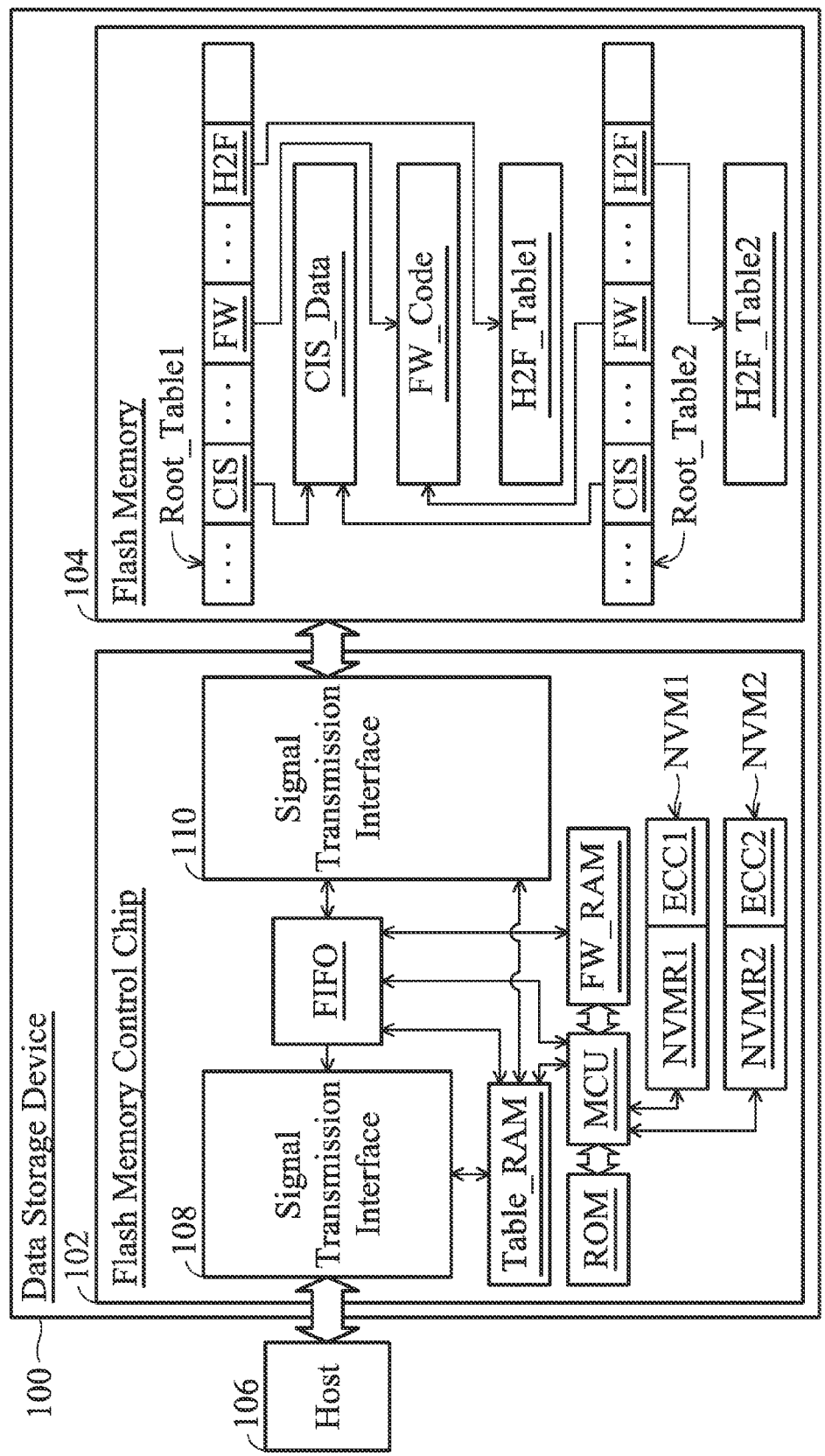
FIG. 1 depicts a data storage device 100 in accordance with an exemplary embodiment of the disclosure, which includes a flash memory control chip 102.

FIG. 1 depicts a data storage device 100 in accordance with an exemplary embodiment of the disclosure. The data storage device 100 comprises a flash memory control chip 102 and a flash memory 104. The flash memory control chip 102 operates the flash memory 104 in accordance with commands issued from a host 106.

Referring to FIG. 1, the architecture of the flash memory control chip 102 is shown. The flash memory control chip 102 may communicate with the host 106 via the signal transmission interface 108 and communicate with the flash memory 104 via the signal transmission interface 110. There is a buffer FIFO arranged between the signal transmission interface 108 and the signal transmission interface 110. The flash memory control chip 102 further provides other storage areas for several purposes. The buffer FIFO and the other storage areas are operated by a microcontroller MCU of the flash memory control chip 102. The storage areas may be volatile or non-volatile. In this exemplary embodiment shown in FIG. 1, the volatile storage areas may include RAM areas Table_RAM and FW_RAM, and the non-volatile storage areas may include a read-only memory ROM and the non-volatile storage areas NVM1 and NVM2. The RAM area Table_RAM is provided for real-time update of the logical-to-physical address mapping relationship between the host 106 and the flash memory 104. The firmware code downloaded from the flash memory 104 is temporarily buffered in the RAM area FW_RAM. The read-only memory ROM is stored with ROM codes to be executed by the microcontroller MCU. The non-volatile storage areas NVM1 and NVM2 (e.g., implemented by an MRAM, an RRAM or any non-volatile memory) are provided to store the information that helps the microcontroller MCU to retrieve a logical-to-physical address mapping relationship between the host 106 and the flash memory 104.

The logical-to-physical address mapping relationship between the host 106 and the flash memory 104 is stored in the flash memory 104 by the microcontroller MCU. The logical-to-physical address mapping relationship may be stored in the flash memory 104 in a hierarchical form or any other architecture. The microcontroller MCU further stores a root table in the flash memory 104. A mapping relationship pointer is set forth in the root table, to indicate or point to the logical-to-physical address mapping relationship stored in the flash memory 104. Based on the special data update characteristic of the flash memory 104 (i.e., the updated data is not overwritten onto the old storage area but written to a spare area), the updated logical-to-physical address mapping relationship is written to a different space from where the old logical-to-physical address mapping relationship is stored in the flash memory 104. As shown, the new logical-to-physical address mapping relationship H2F_Table2 is stored in a different space from that which is storing the old logical-to-physical address mapping relationship H2F_Table1, and the microcontroller MCU updates the root table corresponding thereto. The updated root table Root_Table2 is written to a different space from where the old root table Root_Table1 in the flash memory 104. The mapping relationship pointer H2F set forth in the root table Root_Table1 indicates where the logical-to-physical address mapping relationship H2F_Table1 is stored in the flash memory 104. The mapping relationship pointer H2F set forth in the root table Root_Table2 indicates where the logical-to-physical address mapping relationship H2F_Table2 is stored in the flash memory 104 (e.g. indicating a flash memory address of the logical-to-physical address mapping relationship H2F_Table2). The microcontroller MCU further uses the non-volatile storage areas NVM1 and NVM2 to store root table pointers NVMR1 and NVMR2 to indicate where the respective root tables Root_Table1 and Root_Table2 are stored in the flash memory 104. The root table pointer NVMR1 stored in the non-volatile storage area NVM1 indicates the flash memory address of the root table Root_Table1. The root table pointer NVMR2 stored in the non-volatile storage area NVM2 indicates the flash memory address of the root table Root_Table2. The non-volatile storage areas NVM1 and NVM2 are updated by turns corresponding to the updates of the root table. Thus, the two root tables Root_Table1 and Root_Table2 that are indicated by the root table pointers NVMR1 and NVMR2 are the latest two versions of the logical-to-physical address mapping relationship. The logical-to-physical address mapping relationships H2F_Table1 and H2F_Table2 are alternatives to each other, to be downloaded from the flash memory 104 in response to a power restoration request due to a power failure event.

For example, when the host 106 issues a power restoration request, the microcontroller MCU may access the flash memory 104 in accordance with the root table pointer stored in the non-volatile storage area NVM1 or NVM2 and thereby the root table corresponding thereto is read out from the flash memory 104. Based on the mapping relationship pointer set forth in the root table, the microcontroller MCU accesses the flash memory 104 for the logical-to-physical address mapping relationship. Thus, the logical-to-physical address mapping relationship between the host 106 and the flash memory 104 is instantly obtained without spending a lot of time in scanning the flash memory 104.

In an exemplary embodiment, the microcontroller MCU further encodes error correction code (abbreviated to 'ecc') into the root table pointers in the non-volatile storage areas NVM1 and NVM2 when storing the rooting table. As shown in FIG. 1, the root table pointer NVMR1 is recorded in the non-volatile storage area NVM1 with the ecc ECC1, and the root table pointer NVMR2 is recorded in the non-volatile storage area NVM2 with the ecc ECC2. In response to a power restoration request, the microcontroller MCU performs an error correction process on the root table pointers NVMR1 and NVMR2 in the non-volatile storage areas NVM1 and NVM2 based on the ecc ECC1 and ECC2, respectively, to determine whether an update process of the non-volatile storage area NVM1 or NVM2 was interrupted by a power failure event. When a non-volatile storage area is error-correction failed, it may indicate that a power failure event occurred during an update process of the non-volatile storage area. Between the mutually alternative non-volatile storage areas NVM1 and NVM2, the one with a successful update process is given a higher priority to provide the root table pointer for retrieving the logical-to-physical mapping relationship from the flash memory 104.

In some exemplary embodiments, the microcontroller MCU writes the root table in the flash memory 104 with error correction code (e.g. ecc). In response to a power restoration request, the microcontroller MCU further performs an error correction process on the root table based on the ecc encoded therefor, to determine whether an update process of the root table was interrupted by a power failure event. The unreliable root table, therefore, is picked out.

Because of the dual non-volatile storage areas NVM1 and NVM2, there is still an alternative solution when the root table pointer with the higher priority has been damaged.

In the aforementioned exemplary embodiments, multiple versions of the root table pointer are recorded in the flash memory control chip 102 for retrieving a correct logical-to-physical address mapping relationship from the flash memory 104. It is not intended to limit the version number. In another exemplary embodiment, only the latest version of the root table pointer is recorded and the flash memory control chip 102 is modified to provide just single non-volatile storage area, e.g. NVM1, for recording of the latest version of the root table pointer. In response to a power restoration request from the host 106, the flash memory control chip 102 accesses the flash memory 104 in accordance with the root table pointer (e.g. NVMR1) for the logical-to-physical address mapping relationship.

Furthermore, card information structure (CIS) data CIS_Data and/or firmware code FW_Code contained in the flash memory 104 may be indicated by pointers set forth in a root table. As shown, a pointer CIS (e.g. indicating a flash memory address) is set forth in both the root tables Root_Table1 and Root_Table2 to indicate where the CIS data CIS_Data is stored in the flash memory 104, and a pointer FW (e.g. indicating a flash memory address) is set forth in both the root tables Root_Table1 and Root_Table2 to show where the firmware code FW_Code is stored in the flash memory 104. In this manner, the CIS data CIS_Data and the firmware code FW_Code required for responding to the power restoration request are quickly retrieved from the flash memory 104 based on the root table pointer NVMR1 or NVMR2 stored in the non-volatile storage areas NVM1 or NVM2.

In addition to the aforementioned mapping relationship pointer (H2F), the CIS data pointer (CIS) and the firmware code pointer (FW), the root table may further contain other data or address information required for responding to the power restoration request.

Figure 2:
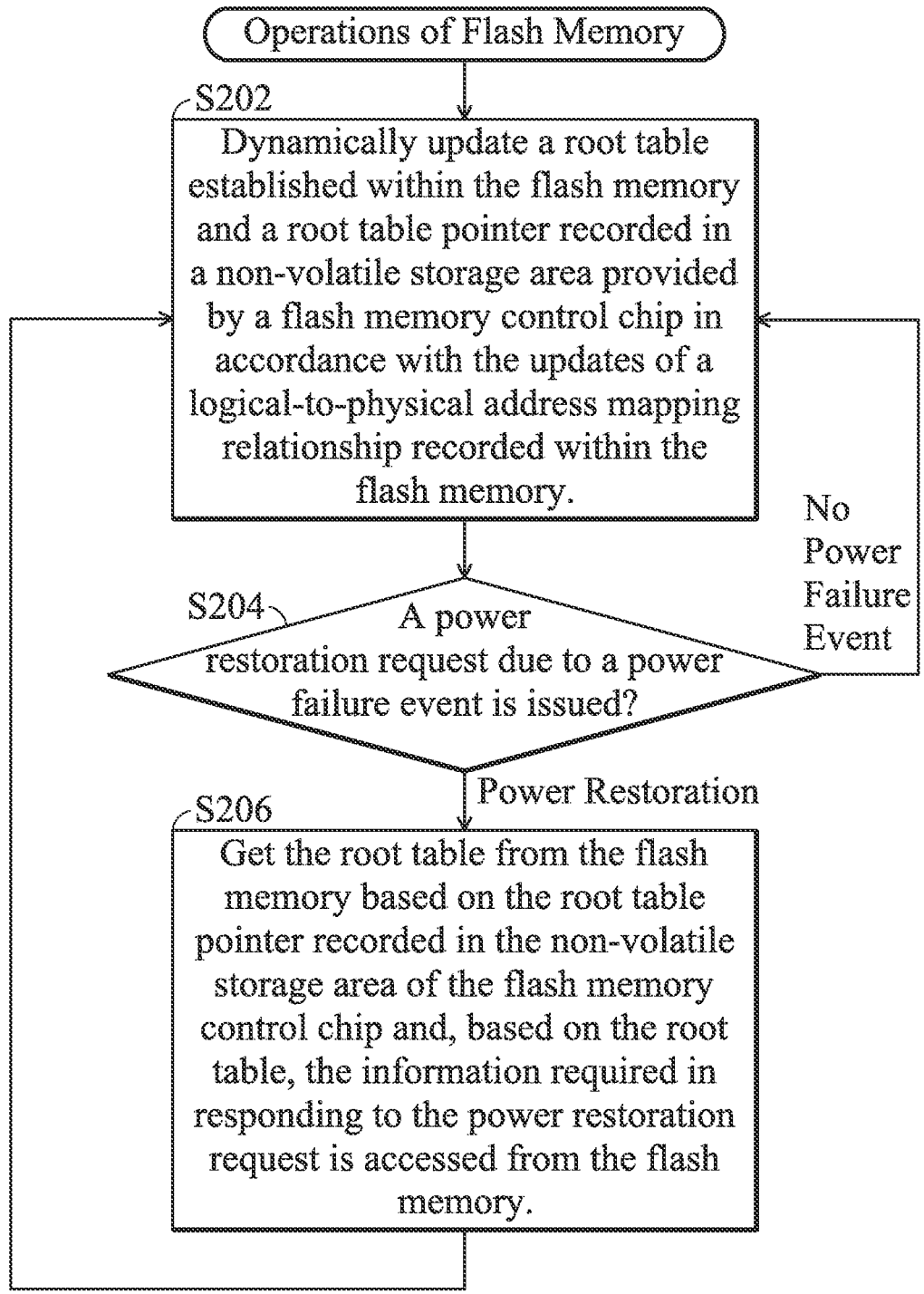
FIG. 2 is a flowchart depicting how a flash memory is operated in accordance with an exemplary embodiment of the disclosure.

FIG. 2 is a flowchart depicting how a flash memory is operated in accordance with an exemplary embodiment of the disclosure. In step S202, a root table established within the flash memory and a root table pointer recorded in a non-volatile storage area provided by a flash memory control chip are dynamically updated in accordance with the updates of a logical-to-physical address mapping relationship recorded within the flash memory. When it is determined in step S204 that a power restoration request is issued due to a power failure event, step S206 is performed to get the root table from the flash memory based on the root table pointer recorded in the non-volatile storage area provided of the flash memory control chip and, based on the root table, the information (e.g., including the logical-to-physical address mapping relationship or even the card information structure data and firmware code) required in responding to the power restoration request is accessed from the flash memory.

Figure 3A:
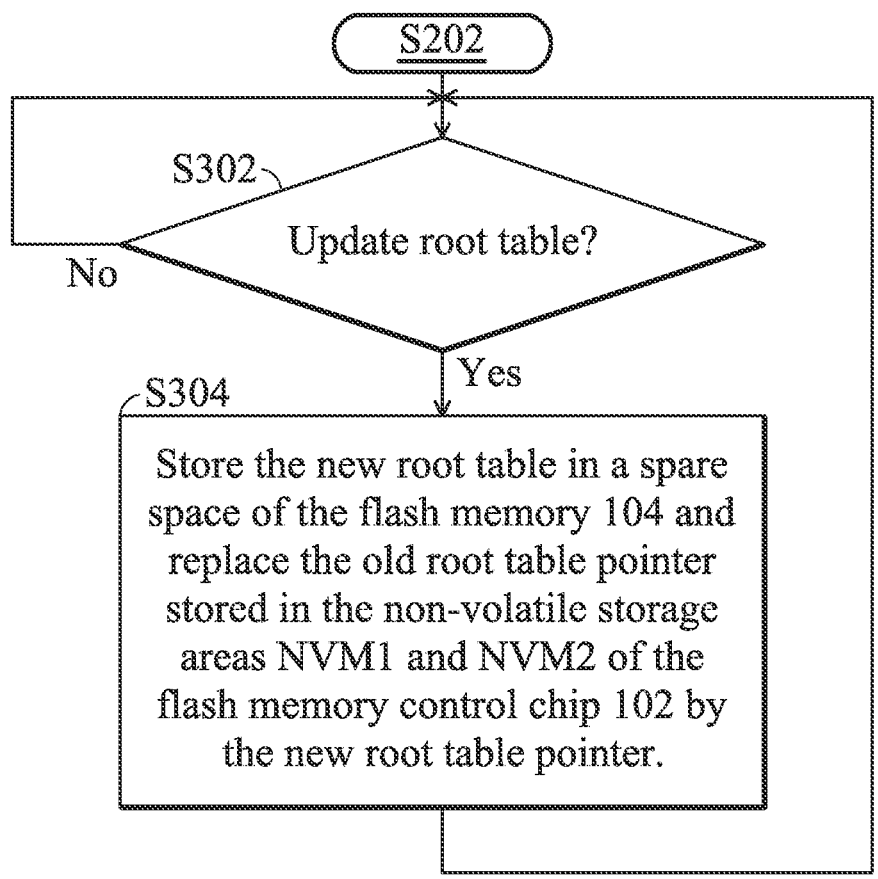
FIG. 3A is a flowchart wherein step S202 of FIG. 2 is discussed in detail with respect to the architecture of FIG. 1.

FIG. 3A is a flowchart wherein step S202 of FIG. 2 is discussed in detail with respect to the architecture of FIG. 1. In step S302, it is checked whether the root table has to be updated. When changing the logical-to-physical address mapping relationship stored in the flash memory 104, the root table has to be updated accordingly and step S304 is performed. In step S304, the new root table is stored into a spare space of the flash memory 104 and the old root table pointer stored in the non-volatile storage area NVM1 or NVM2 of the flash memory control chip 102 is replaced by the new root table pointer. After step S304, step S302 is repeated to continuously check whether the root table has to be updated. In this manner, the root table pointer is changed in accordance with the changes to the root table and the latest root table pointer is updated in the non-volatile storage areas NVM1 and NVM2 by turns.

Figures 1, 3B:
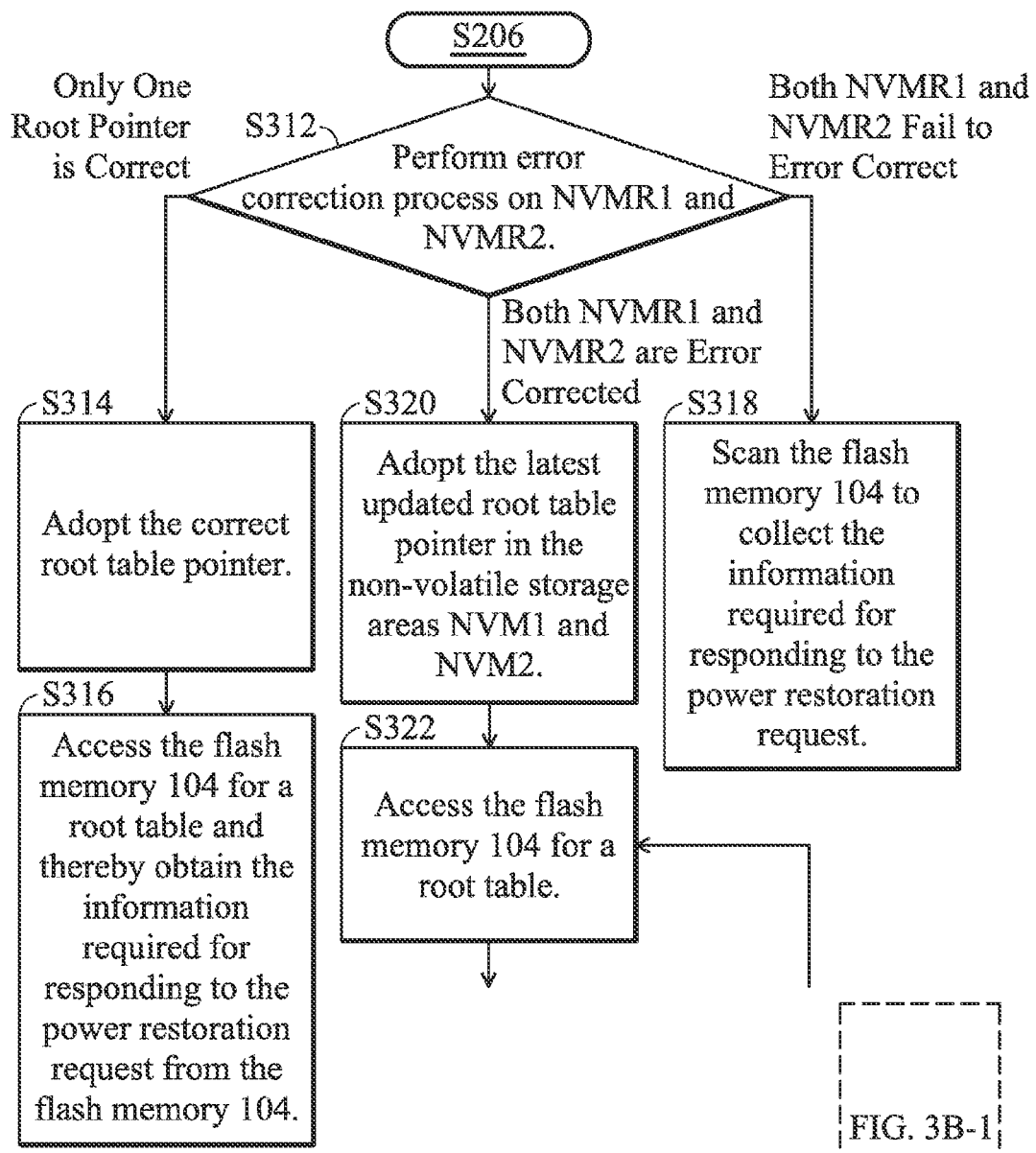
Figures 2, 3B:
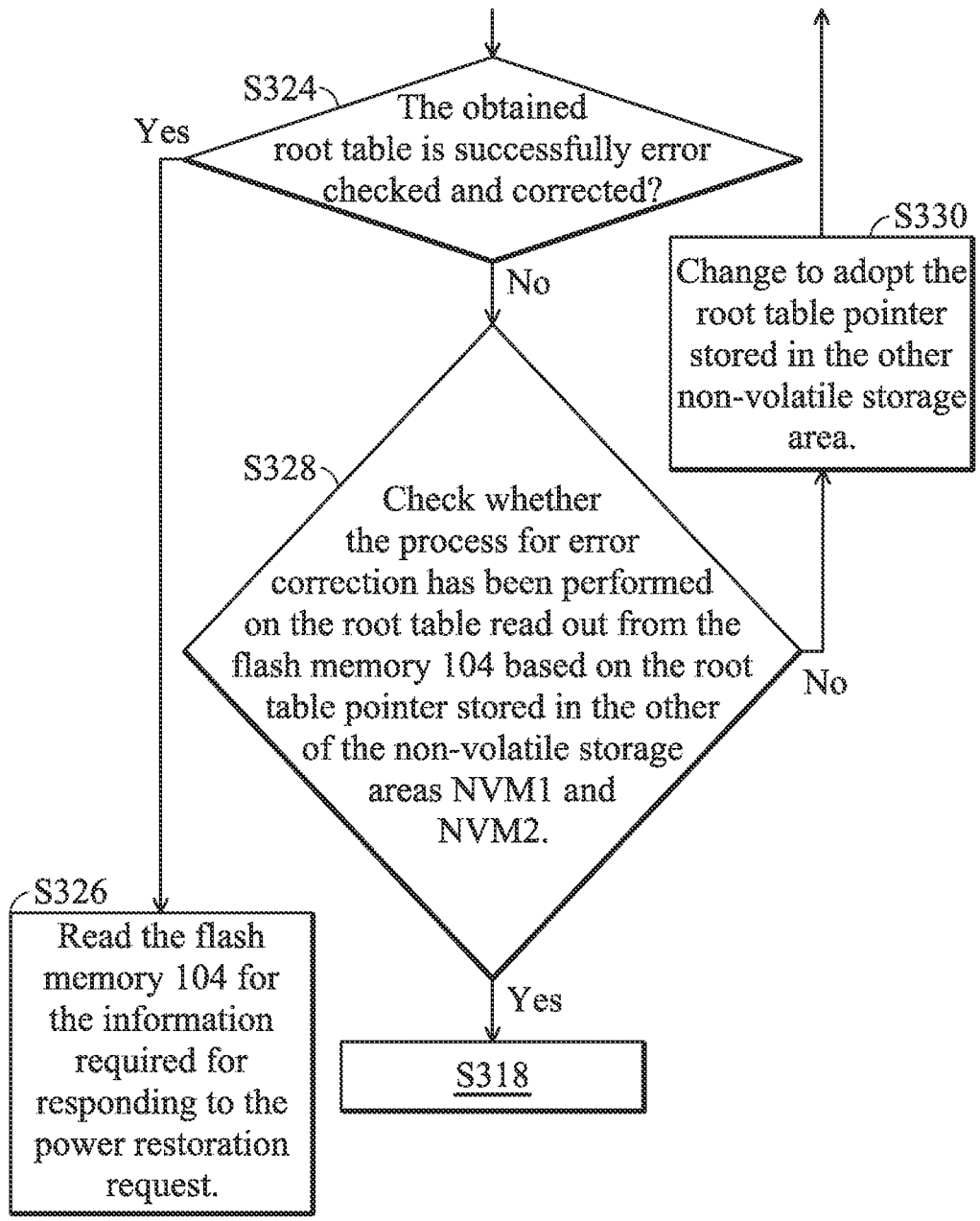

FIG. 3B-1 and FIG. 3B-2 show a flowchart, wherein step S206 of FIG. 2 is discussed in detail with respect to the architecture of FIG. 1. In step S312, the root table pointers NVMR1 and NVMR2 recorded in the non-volatile storage areas NVM1 and NVM2 are error corrected based on the error correction code ECC1 and ECC2, respectively. When only one of the root table pointers NVMR1 and NVMR2 in the non-volatile storage areas NVM1 and NVM2 is determined to be correct, step S314 is performed to adopt the correct root table pointer. In step S316, a root table is read out from the flash memory 104 based on the correct root table pointer adopted in step S314 and the information (e.g., including the logical-to-physical address mapping relationship or even the card information structure data CIS_Data and firmware code FW_Code) required for responding to the power restoration request is read out from the flash memory 104 based on the root table. When the non-volatile storage areas NVM1 NVM2 both fail to be error corrected, step S318 is performed to scan the flash memory 104 to collect the information required for responding to the power restoration request. When both the non-volatile storage areas NVM1 and NVM2 are determined to be correct, step S320 is performed to adopt the latest updated root table pointer in the non-volatile storage area NVM1 or NVM2. In step S322, a root table is read out from the flash memory 104 based on the latest updated root table pointer adopted in step S320. In step S324, a process for error correction is performed on the root table read out from the flash memory 104 in step S322. When it is determined in step S324 that the root table has been successfully error corrected, step S326 is performed to read the flash memory 104 for the information required for responding to the power restoration request. When it is determined in step S324 that the root table obtained in step S322 has the error-correction failed, step S328 is performed to check whether the process for error correction has been performed on the root table read out from the flash memory 104 based on the root table pointer stored in the other of the non-volatile storage areas NVM1 and NVM2. When there is still a root table waiting to be checked, step S330 is performed to adopt the root table pointer stored in the other non-volatile storage area. After step S330, steps S322 and S324 are repeated. When it is determined in step S328 that the process for error correction has been performed on the root tables read out from the flash memory 104 based on the root table pointers NVMR1 and NVMR2 stored in the non-volatile storage areas NVM1 and NVM2, step S318 is performed to scan the flash memory 104 to collect the information required for responding to the power restoration request. The purpose of step S324 is further discussed in the following. When the procedure proceeds to step S324, it means that the root table pointers NVMR1 and NVMR2 have both been successfully error corrected and are correctly written into the non-volatile storage areas NVM1 and NVM2 by the microcontroller MCU without being interrupted by a power failure event. However, it is not guaranteed that data are correctly written into the flash memory 104 by the microcontroller MCU based on the root table pointers NVMR1 and NVMR2. For example, a power failure event may occur when the root table is updated onto the flash memory 104. Step S324 is performed to check whether the root table is correctly written into the flash memory 104 without being damaged by a power failure event. When step S324 shows that the obtained root table is error-correction failed, it means that the microcontroller MCU does not correctly write the root table into the flash memory 104 based on the root table pointer. After step S324, step S318 may start the scan of the flash memory 104 from the space indicated by the root table that was correctly written into the flash memory 104 the last time, to try to retrieve the correct logical-to-physical address mapping relationship. When the root table written into the flash memory 104 the last time also has the error-correction failed, more time is consumed on scanning the flash memory 104.

Figure 4:
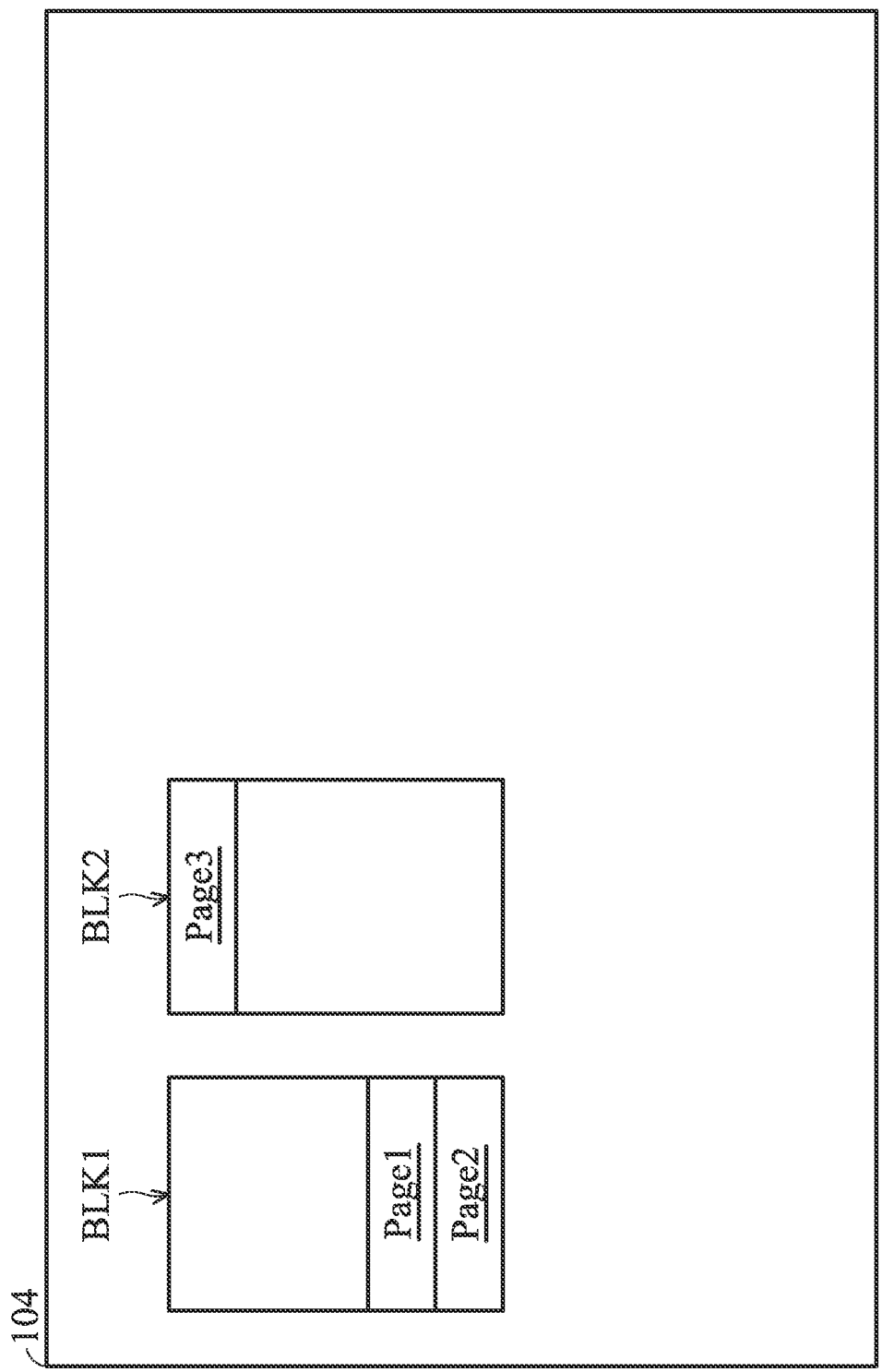
FIG. 4 shows how to identify the update sequence of the non-volatile storage areas NVM1 and NVM2.

FIG. 4 depicts how to identify the update sequence of the non-volatile storage areas NVM1 and NVM2. When the root table pointer NVMR1 recorded in the non-volatile storage area NVM1 and the root table pointer NVMR2 recorded in the non-volatile storage area NVM2 both indicate the same block, it is determined by the microcontroller MCU that the root table pointer indicating higher address is the newer root table pointer. For example, when the root table pointer NVMR1 recorded in the non-volatile storage area NVM1 indicates page Page1 of block BLK1 and the root table pointer NVMR2 recorded in the non-volatile storage area NVM2 indicates page Page2 of block BLK1, the root table pointer NVMR2 indicating page Page2, at a higher address in comparison with page Page1, is determined as the newer root table pointer. When the root table pointer NVMR1 recorded in the non-volatile storage area NVM1 indicates a block that different from the block indicated by the root table pointer NVMR2 recorded in the non-volatile storage area NVM2, it is determined by the microcontroller MCU that the root table pointer indicating to the lower address is the newer root table pointer. For example, when the root table pointer NVMR1 recorded in the non-volatile storage area NVM1 points to page Page2 of block BLK1 and the root table pointer NVMR2 recorded in the non-volatile storage area NVM2 points to page Page3 of block BLK2, the root table pointer NVMR2 pointing to page Page3, at a lower address in comparison with page Page2, is determined as the newer root table pointer.

The aforementioned technical steps may be performed by executing firmware code. The firmware code may be stored in the read only memory ROM and executed by a microcontroller MCU. Any technique using the aforementioned concept to control a flash memory is within the scope of the invention. The invention further involves flash memory control methods, which are not limited to any specific control chip architecture.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory control chip, operating a flash memory in accordance with commands issued from a host, comprising:
multiple non-volatile storage areas external to the flash memory; and
a microcontroller, storing a root table and a logical-to-physical address mapping relationship between the host and the flash memory in the flash memory and storing a root table pointer in the multiple non-volatile storage areas by turns with respect to updates of the root table to maintain multiple versions of the root table, the logical-to-physical address mapping relationship and the root table pointer,
wherein the root table pointer is configured to indicate where the corresponding version of the root table is stored in the flash memory;
wherein a mapping relationship pointer is set forth in the root table to indicate where the corresponding version of the logical-to-physical address mapping relationship is stored in the flash memory;
wherein in response to a power restoration request issued from the host, the microcontroller retrieves the logical-to-physical address mapping relationship from the flash memory in accordance with an adopted root table pointer which is the latest version of the root table pointer correctly obtained from the multiple non-volatile storage areas.

2. The flash memory control chip as claimed in claim 1, wherein: the microcontroller further encodes error correction code into different versions of the root table pointer in the multiple non-volatile storage areas; and in response to the power restoration request, the microcontroller performs an error correction process on the different versions of the root table pointer in the multiple non-volatile storage areas based on the error correction code encoded therein to determine whether an update process of any non-volatile storage area of the multiple non-volatile storage areas was interrupted by a power failure event.

3. The flash memory control chip as claimed in claim 1, wherein: the microcontroller further encodes error correction code into different versions of the root table pointer in the multiple non-volatile storage areas; in response to the power restoration request, the microcontroller performs an error correction process on the different versions of the root table pointer in the multiple non-volatile storage areas based on the error correction code encoded therein to determine whether the different versions of the root table pointer in the multiple non-volatile storage areas are correct and, when only one version of the root table pointer in the multiple non-volatile storage areas is determined to be correct, the microcontroller accesses the flash memory in accordance with the correct root table pointer.

4. The flash memory control chip as claimed in claim 1, wherein: when different versions of the root table pointer correctly obtained from the multiple non-volatile storage areas point to a same block of the flash memory, the microcontroller determines that the root table pointer pointing to a higher address is the latest version of the root table pointer correctly obtained from the multiple non-volatile storage area; and when the different versions of the root table pointer correctly obtained from the multiple non-volatile storage areas point to different blocks of the flash memory, the microcontroller determines that the root table pointer pointing to a lower address is the latest version of the root table pointer correctly obtained from the multiple non-volatile storage areas.

5. The flash memory control chip as claimed in claim 1, wherein: the microcontroller further encodes error correction code into different versions of root table when storing the different versions of the root table in the flash memory; and in response to the power restoration request, the microcontroller performs an error correction process on the root table, accessed according to the adopted root table pointer, based on the error correction code encoded therein, to determine whether an update process of the root table was interrupted by a power failure event.

6. The flash memory control chip as claimed in claim 5, wherein:
when determining that data accessed from the flash memory in accordance with the adopted root table pointer is error-correction failed, the microcontroller switches to access the flash memory in accordance with another root table pointer correctly obtained from the multiple non-volatile storage areas.

7. The flash memory control chip as claimed in claim 1, wherein:
the flash memory is further stored with card information structure data, and a pointer pointing to the card information structure data is set forth in the root table by the microcontroller to indicate where the card information structure data is stored in the flash memory; and
the flash memory is further stored with firmware code, and a pointer pointing to the firmware code is set forth in the root table by the microcontroller to indicate where the firmware code is stored in the flash memory.

8. A non-transitory data storage device, comprising: a flash memory; and a flash memory control chip, operating the flash memory in accordance with commands issued from a host and comprising: multiple non-volatile storage areas external to the flash memory; and a microcontroller, storing a root table and a logical-to-physical address mapping relationship between the host and the flash memory in the flash memory and storing a root table pointer in the multiple non-volatile storage areas by turns with respect to updates of the root table to maintain multiple versions of the root table, the logical-to-physical address mapping relationship and the root table pointer, wherein the root table pointer is configured to indicate where the corresponding version of the root table is stored in the flash memory; wherein a mapping relationship pointer is set forth in the root table to indicate where the corresponding version of the logical-to-physical address mapping relationship is stored in the flash memory; wherein in response to a power restoration request issued from the host, the microcontroller retrieves the logical-to-physical address mapping relationship from the flash memory in accordance with an adopted root table pointer which is the latest version of the root table pointer correctly obtained from the multiple non-volatile storage areas.

9. A flash memory control method, operating a flash memory in accordance with commands issued from a host, comprising:
 providing multiple non-volatile storage areas external to the flash memory;
 storing a logical-to-physical address mapping relationship between the host and the flash memory in the flash memory, storing a root table in the flash memory and storing a root table pointer in the multiple non-volatile storage areas by turns with respect to updates of the root table to maintain multiple versions of the root table, the logical-to-physical address mapping relationship and the root table pointer, wherein the root table pointer is configured to indicate where the corresponding version of the root table is stored in the flash memory, and a mapping relationship pointer is set forth in the root table to indicate where the corresponding version of the logical-to-physical address mapping relationship is stored in the flash memory;
 in response to a power restoration request issued from the host, retrieving the logical-to-physical address mapping relationship from the flash memory in accordance with an adopted root table pointer which is the latest version of the root table pointer correctly obtained from the multiple non-volatile storage areas.

10. The flash memory control method as claimed in claim 9, further comprising: encoding error correction code into different versions of the root table pointer in the multiple non-volatile storage areas; and in response to the power restoration request, performing an error correction process on the different versions of the root table pointer in the multiple non-volatile storage areas based on the error correction code encoded therein to determine whether an update process of any non-volatile storage area of the multiple non-volatile storage areas was interrupted by a power failure event.

11. The flash memory control method as claimed in claim 9, further comprising: encoding error correction codes into different versions of the root table pointer in the multiple non-volatile storage areas; and in response to the power restoration request, performing an error correction process on the different versions of the root table pointer in the multiple non-volatile storage areas based on the error correction code encoded therein to determine whether the different versions of the root table pointer in the multiple non-volatile storage areas are correct, wherein: when only one version of the root table pointer in the multiple non-volatile storage areas is determined to be correct, the flash memory is accessed in accordance with the correct root table pointer.

12. The flash memory control method as claimed in claim 9, further comprising: determining that the root table pointer pointing to a higher address is the latest version of the root table pointer correctly obtained from the multiple non-volatile storage areas when different versions of the root table pointer correctly obtained from the multiple non-volatile storage areas point to a same block of the flash memory; and determining that the root table pointer pointing to a lower address is the latest version of the root table pointer correctly obtained from the multiple non-volatile storage areas when the different versions of the root table pointer correctly obtained from the multiple non-volatile storage areas point to different blocks of the flash memory.

13. The flash memory control method as claimed in claim 9, further comprising: encoding error correction codes into the different versions of the root table when storing the different versions of the root table in the flash memory; and in response to the power restoration request, performing an error correction process on the root table, accessed according to the adopted root table pointer, based on the error correction codes encoded therefor, to determine whether an update process of the root table was interrupted by a power failure event.

14. The flash memory control method as claimed in claim 13, further comprising:
 when data accessed from the flash memory in accordance with the adopted root table pointer is error-correction failed, the flash memory is switched to be accessed in accordance with another root table pointer correctly obtained from the multiple non-volatile storage areas.

15. The flash memory control method as claimed in claim 9, wherein:
 a pointer pointing to card information structure data stored in the flash memory is further set forth in the root table to indicate where the card information structure data is stored in the flash memory; and
 a pointer pointing to firmware code stored in the flash memory is further set forth in the root table to indicate where the firmware code is stored in the flash memory.

* * * * *